United States Patent [19]

Nishizawa

[11] Patent Number: 4,636,647
[45] Date of Patent: Jan. 13, 1987

[54] PACKAGE FOR OPTICAL ELEMENT
[75] Inventor: Hideaki Nishizawa, Osaka, Japan
[73] Assignee: Sumitomo Electric Industries, Ltd., Osaka, Japan
[21] Appl. No.: 610,414
[22] Filed: May 15, 1984
[30] Foreign Application Priority Data
  May 31, 1983 [JP] Japan .................................. 58-97628
[51] Int. Cl.⁴ ........................................... G02B 27/00
[52] U.S. Cl. ...................................... 250/551; 250/239
[58] Field of Search .......... 250/551, 578, 239, 211 R, 250/211 J; 358/212, 213; 357/30, 31, 32, 24, 19

[56] References Cited
U.S. PATENT DOCUMENTS
4,227,098 10/1980 Brown et al. ........................ 250/551
4,233,614 11/1980 Botez et al. ............................ 357/30

FOREIGN PATENT DOCUMENTS
55-13963 1/1980 Japan .
WO82/02800 8/1982 PCT Int'l Appl. .

Primary Examiner—David C. Nelms
Assistant Examiner—James G. Gatto
Attorney, Agent, or Firm—Cushman, Darby & Cushman

[57] ABSTRACT

A package for an optical element which receives or emits light thereinto or therefrom and is bonded on a substrate is disclosed. The substrate is a transparent one. An electrode pad including a window therein is formed on the top of the substrate and the optical element is bonded on the top of the electrode pad. By this structure, light is received into or emitted from the optical element through the transparent substrate and the window formed in the electrode pad.

3 Claims, 13 Drawing Figures

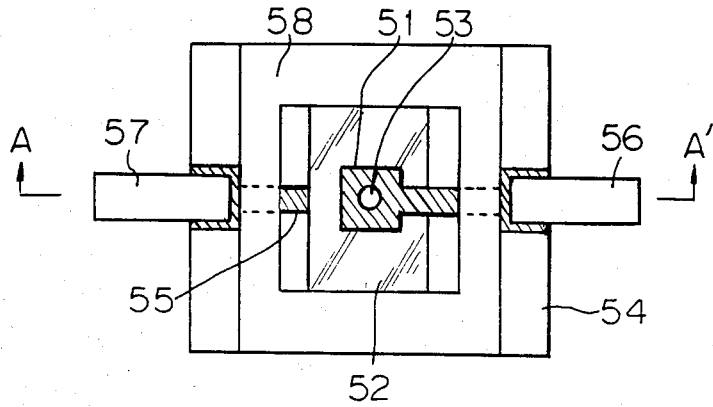
Fig. 7
Fig. 7 (a)
Fig. 7 (b)
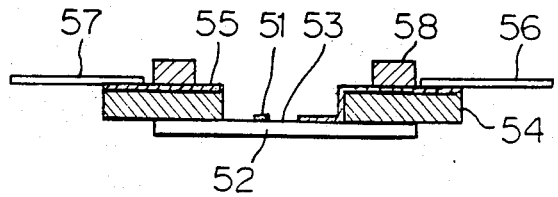
Fig. 8
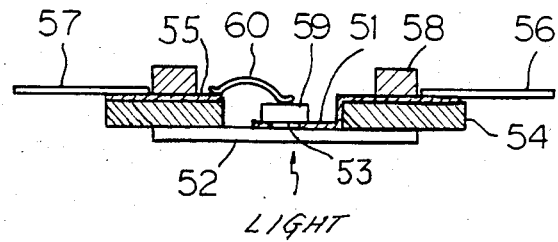

PACKAGE FOR OPTICAL ELEMENT

BACKGROUND OF THE INVENTION

1. Field of the Invention

This invention relates to a package for an optical element adapted to package or receive an optical element such as a light emitting diode or photodiode.

2. Description of the Prior Art

The principal technical requirements called for in a package for receiving an optical element such as a light emitting diode or photodiode are: (1) that the package has a transparent light transmitting construction through which light is taken into or out of the optical element, (2) that electrodes can be led out of the optical element by providing wiring on the optical element by die-bonding or wire-bonding, and (3) that the package has a hermetically sealed construction in order to preserve its properties for guarding against environmental changes and its reliability. Examples of such packages in the prior art will be described hereinbelow in connection with a photodiode.

FIGS. 1a and 1b show examples of a first type of prior art package for an optical element. In this first type of package, conventional TO-18 type packages 11a, 11b have photodiodes 15a, 15b, respectively, die-bonded thereto by means of epoxy resin, eutectic solder or the like. Au wires 14a, 14b bonded to the photodiodes 15a, 15b, respectively, and caps 12a, 12b having light permeable windows formed of Kovar glass 13a and a sapphire plate 13b welded to the packages 11a, 11b, respectively, as shown in FIGS. 1a and 1b. These prior art packages, however, have the drawback that lack of dimensional precision as between the caps 12a, 12b and packages 11a, 11b occurring in the manufacture of the same, and also the presence of the Au wires 14a, 14b on the photodiodes made the distance between the upper surface of the photodiode 15a or 15b and Kovar glass 13a or sapphire plate 13b great and as a result, the optical coupling efficiency between the photodiode 15a or 15b and optical fiber 16a or 16b is impaired.

Next, an example of a second type of prior art package which is different from the first type with respect to the light receiving system, is shown in FIG. 2. In this example, a conventional TO-46 type package 21 is provided with a through opening 23, a photodiode 25 is die-bonded to the package 21 coaxially with the through opening 23. Au wire 24 is bonded to the photodiode 25 and a cap 22 is welded to the package 21 to provide the construction as shown in FIG. 2. This construction, however, also has the drawback that the distance between the photodiode 25 and optical fiber 26 is great resulting in the optical coupling efficiency being impaired as described in connection with the first type of the prior art.

FIG. 3 shows an example of a third type of the prior art which eliminates the drawback inherent in the second type referred to hereinabove. This third type of prior art example is different from the second type in that the optical fiber 36 is adapted to be inserted into the through opening 33 in the package 31 so that the distance between the photodiode 35 and optical fiber 36 can be shortened. In this example, however, the optical fiber 36 tends to contact the photodiode 35 and damages the photodiode 35 when the optical fiber 36 is inserted into the package 31 and as a result, it has the disadvantage that the assembly of the components thereof is very difficult.

FIG. 4 shows an example of a fourth type of the prior art in which Kovar glass 43 seals the through opening 23 in the package in the second type of prior art example shown in FIG. 2. The fourth type of prior art example, however, also has the same drawback as described in connection with the second type.

Needless to say, even when other metals or ceramics are used in the construction of the above-mentioned examples of any type of the prior art package, the same drawback is inevitably present.

Further drawbacks common to the second and fourth type of prior art examples will now be described. FIG. 5 shows the light receiving portions in the second type of prior art examples. In the construction shown in FIG. 5a, a photodiode 25 including a light receiving area 25a is die-bonded to the upper surface of a metal or ceramic substrate 21. The angular aperture for the incoming light is limited by the edge 21a of the substrate 21. FIG. 5b shows the state wherein the photodiode 25 moves out of place at the time of die-bonding and the angular aperture for the incoming light is substantially limited on one side thereof. Thus, in these examples, a rigidly precise die-bonding technology is required. In these examples also, in order to increase the above-mentioned angular aperture, it is required that the thickness of the substrate 21 is lessened and the cross-sectional area of the through opening 23 is increased. However, when the thickness of the substrate 21 is lessened, the package itself presents a problem with respect to strength and when the cross-sectional area of the through opening 23 is increased, there is the problem that the size of the photodiode 25 has to be increased accordingly. Furthermore, in these examples, there is the problem that ceramics or metal have to machined to allow formation of a through opening 23 by a mechanical process, the precision of which imposes limitations on the construction of the package.

SUMMARY OF THE INVENTION

Therefore, a principal object of the subject invention is to eliminate the drawbacks inherent in these prior art packages described hereinabove and to provide a novel package for an optical element which can substantially increase the optical coupling efficiency between the optical element and the optical fiber.

Another object of the subject invention is to provide a novel package for an optical element which enables the designing of the package more freely than in the case of prior art packages fulfilling the above object.

A further object of the present invention is to provide a novel package for optical elements which enables the working of the package more precisely and easily than in the prior art without substantially increasing the size of the optical element which fulfills the above objects.

The present invention may be summarized as a package for an optical element which receives or emits light thereinto or therefrom and is bonded on a substrate, wherein said substrate is a transparent one, an electrode pad including a window therein is formed on the top of said substrate and said optical element is bonded on the top of said electrode pad whereby said light is received into or emitted from said optical element through said transparent substrate and the window formed in said electrode pad.

BRIEF DESCRIPTION OF THE DRAWINGS

FIG. 7a is a top plan view of a half-finished product of the package according to the present invention;

FIG. 7b is a sectional view taken along line A—A' of FIG. 7a;

FIG. 8 is a side elevational view of the package of the invention applied to a photodiode.

DETAILED DESCRIPTION OF THE PREFERRED EMBODIMENT

The present invention will now be explained, in reference to the attached drawings, as follows.

Figure 6:
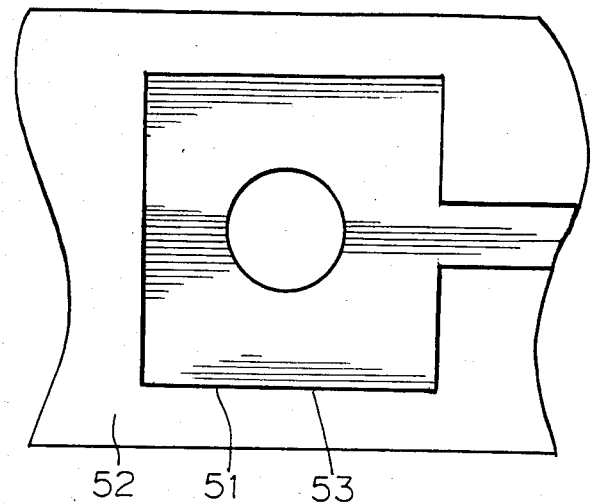
FIGS. 6a and 6b are top plan and side elevational views respectively of the main portion of the package according to the present invention.
Figure 6:
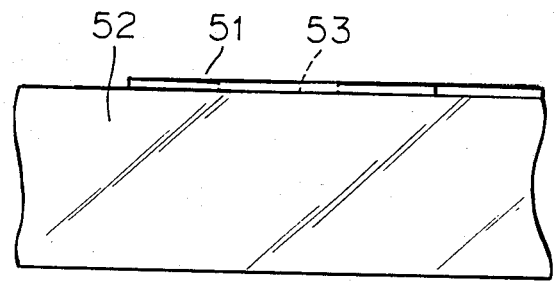

FIGS. 6a and 6b show the basic construction of the package of the invention in which FIG. 6a is a top plan view and FIG. 6b is a side elevational view. A metallic pad 51 for die-bonding an optical element is formed on the upper surface of a sapphire substrate 52. The pad 51 includes a window 53 therein. The shape of the window 53 may be rectangular, circular or any other desired shape. The pad 51 forms an electrode and it may be formed on the sapphire substrate 52 as a metallic layer by photolithographic technology.

FIGS. 7 and 8 show one embodiment of the present invention incorporating the basic construction of the above. The package of this embodiment includes a transparent sapphire substrate 52 and a ring-like peripheral member 54 bonded to the upper surface of the substrate 52. The peripheral member 54 may be formed of ceramic material such as alumina and may be bonded to the substrate 52 by brazing. A metallic electrode pad 51 including a window 53 therein is formed on the top of the substrate 52 as well as on the upper surface of the peripheral member 54 to allow the electrode to be led out. A metallic layer 55 is formed on the peripheral member 54 to form the other electrode. These metallic layers 51, 55 can be formed at the same time by photolithographic technology. Leads 56, 57 are bonded to the metallic layers 51, 55 to lead out the electrodes. Another peripheral member 58 formed of alumina ring is overlapped on and bonded to the first mentioned peripheral member 54 by resin.

As shown in FIG. 8, photodiode 59 is die-bonded to the pad 51 by the use of ring solder such as AuSn eutectic mixture, for example, and to a lead 60 such as Au wire is wire-bonded to the photodiode 59 and to the metallic layer 55 on the peripheral portion 54. For hermetic sealing, it is only necessary to place an alumina cap on the alumina peripheral member 58.

One aspect of the peripheral member 54 is to allow the formation of wire-bonding pads thereon. In another aspect, the peripheral member 54, as well as the member 58, is provided for the purpose of positive air-tight sealing of the package. Namely, if leads 56, 57 are directly led out from the surface of the sapphire substrate 52 without using the peripheral member 54 and the alumina cap is directly bonded on the sapphire substrate 52, the positive air-tight sealing between the substrate 52 and the alumina cap cannot be obtained because, due to the thickness of the metallic layer 55, a step is formed on the substrate 52 and resin sealing material which bonds the alumina cap on the substrate 52 has insufficient bonding force against the sapphire substrate 52. In this invention, however, since the ceramic peripheral member 54, the coefficient of thermal expansion of which is substantially equal to that of sapphire, is bonded to the sapphire substrate 52 by brazing, the alumina peripheral member 58 is bonded to the ceramic peripheral member 54 having bonding pads thereon by resin and, further, the alumina cap is bonded to the alumina peripheral member 58 by resin, so positive hermetic sealing can be obtained easily.

The package of the present invention designed as above makes it easy to couple the optical element, i.e. photodiode 59 in this case, and the optical fiber. This will be now described referring to FIGS. 5a and 9 of the drawings.

Figure 1A:
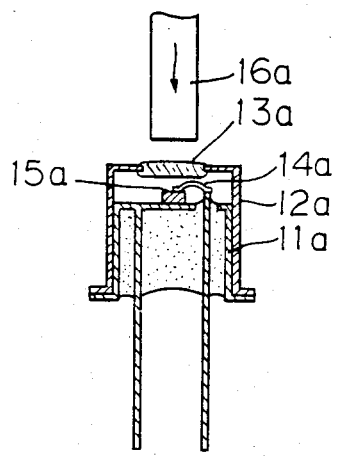
FIGS. 1a and 1b are cross sectional views each showing an example of a first type of prior art package for optical elements.
Figure 1B:
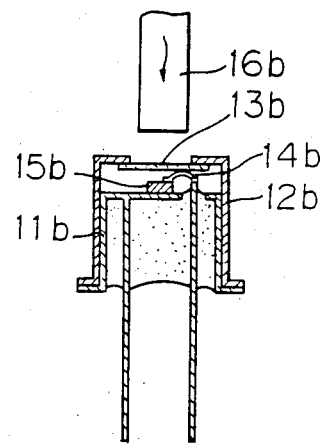
Figure 2:
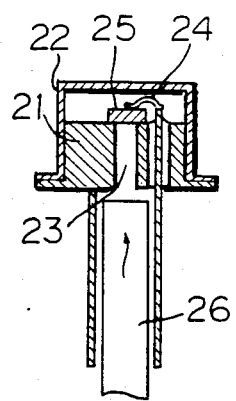
FIGS. 2, 3 and 4 are views similar to FIGS. 1a and 1b but showing examples of second, third and fourth types of prior art packages for optical elements, respectively.
Figure 3:
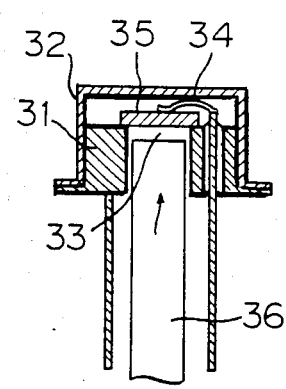
Figure 4:
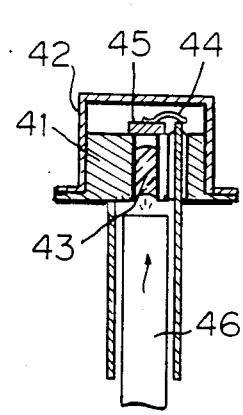
Figure 5:
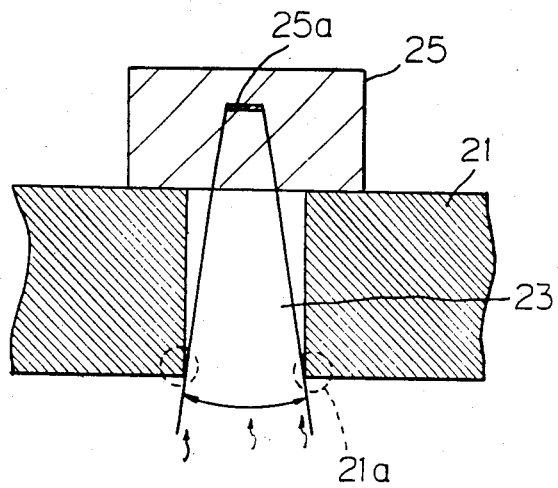
FIGS. 5a and 5b are cross sectional views of a portion of FIG. 2 drawn to an enlarged scale showing the drawback of the same.
Figure 5:
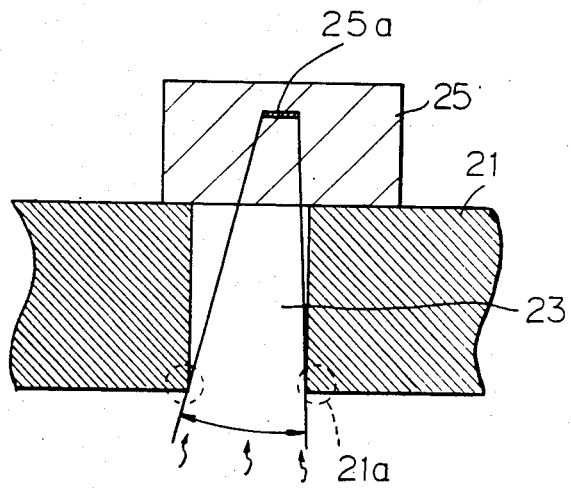
Figure 9:
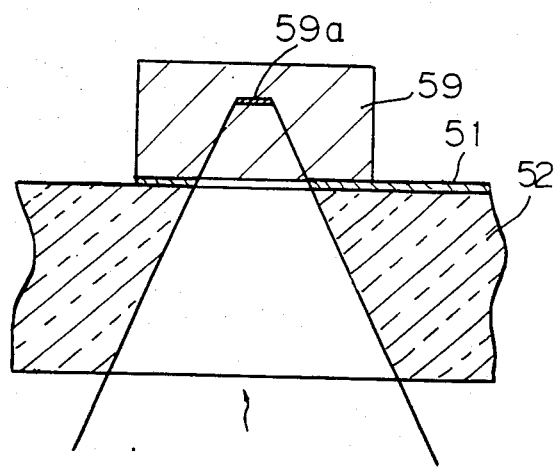
FIG. 9 is an enlarged cross sectional view of a portion of the package of the subject invention showing the basic features of the same.

FIGS. 5a and 9 show the light receiving portions of the prior art package and inventive packages, respectively designed as above in cross-section. The substrate 21 of the prior art package is formed of opaque material such as metal or ceramics whereas the substrate 52 of the package of the invention is formed of sapphire and thus is transparent. Therefore, in the package of the invention, the angular aperture for the incoming light is very wide as shown in FIG. 9. That is, the optical coupling efficiency between the optical fiber and the substrate 52 is substantially improved. And also since transparent sapphire glass is employed as the substrate 52, the thickness of the substrate 52 is not subjected to any limitation in order to obtain a wide angular aperture and thus, the package can be designed more freely than in the case of the prior art.

As to the process for forming the light receiving portion, since the prior art includes a through opening 23 in the substrate 21, machining is required. On the other hand, according to the present invention, the pad for die-bonding the optical element may be formed by photolithography and fine processing is made possible without requiring any machining process. This structure enables more precise and easy working of the package without substantially increasing the size of the optical element.

In the foregoing disclosure, description has been made as to the specific embodiment, but it is apparent that the invention can be equally well applied to light emitting diodes and also to all optical elements which receive and emit light.

What is claimed is:

1. A package for an optical element which receives or emits light, comprising:

a transparent sapphire glass substrate;

a first ceramic peripheral member being bonded on top of the substrate;

an electrode pad including a window formed therein on top of the substrate and extending across the first peripheral member; and a second ceramic ring-shaped peripheral member overlapping with and bonded on top of said first peripheral member so as to surround the optical element;

wherein said optical element is bonded on top of the electrode pad and is extended over the window of the electrode pad;

whereby light is received into and emitted from the optical element through the transparent substrate and the window of the electrode pad.

2. The package for an optical element as set forth in claim 1, in which said electrode pad is a metallic layer formed by photolithography.

3. The package for an optical element as set forth in claim 1, further comprising:

a cap welded to said second peripheral member to seal the package.

* * * * *